United States Patent [19]

Littlebury

[11] Patent Number: 5,008,615
[45] Date of Patent: Apr. 16, 1991

[54] MEANS AND METHOD FOR TESTING INTEGRATED CIRCUITS ATTACHED TO A LEADFRAME

[75] Inventor: Hugh W. Littlebury, Chandler, Ariz.
[73] Assignee: Motorola, Inc., Schaumburg, Ill.
[21] Appl. No.: 431,346
[22] Filed: Nov. 3, 1989
[51] Int. Cl.$^5$ .................. G01R 1/06; G01R 31/02
[52] U.S. Cl. .................. 324/158 F; 324/158 P; 29/827
[58] Field of Search .............. 324/73.1, 158 R, 158 F; 357/70, 74; 174/52.4; 437/8; 29/827, 593; 361/401

[56] References Cited

U.S. PATENT DOCUMENTS

| | | | |
|---|---|---|---|
| 3,596,228 | 7/1971 | Reed, Jr. | 324/158 F |
| 3,970,934 | 7/1976 | Aksu | 324/158 P |
| 3,984,620 | 10/1976 | Robillard et al. | 174/52.4 |
| 4,204,317 | 5/1980 | Winn | 357/70 |
| 4,466,183 | 8/1984 | Burns | 29/827 |
| 4,567,545 | 1/1986 | Nettler, Jr. | 174/52.4 |
| 4,689,556 | 8/1987 | Cedrone | 324/158 F |
| 4,701,781 | 10/1987 | Sankhagowit | 174/52.4 |
| 4,763,409 | 8/1988 | Takekawa et al. | 29/827 |
| 4,764,723 | 8/1988 | Strid | 324/158 P |
| 4,791,473 | 12/1988 | Phy | 357/70 |
| 4,796,080 | 1/1989 | Phy | 324/158 F |
| 4,806,409 | 2/1989 | Walter et al. | 29/827 |
| 4,820,976 | 4/1989 | Brown | 324/158 F |

OTHER PUBLICATIONS

Barsotti et al., "Very High Density Probing", IEEE 1988, International Test Conference; pp. 608-614; 10-4-1988.
Leslie et al., "Membrane Probe Card Technology", IEEE 1988 International Test Conference; pp. 601-607, 12/1988.
Brochure: "Automatic Test Equipment for IC and VLSI Devices"; ANDO Electric, 12/1988.

*Primary Examiner*—Kenneth Wieder
*Assistant Examiner*—Vinh P. Nguyen
*Attorney, Agent, or Firm*—Joe E. Barbee; Stuart T. Langley

[57] ABSTRACT

Apparatus and method of testing integrated circuits after the leads have been trimmed and partially formed, but before the package has been removed from the leadframe. One stage of a progressive trim and form process is adapted to test the integrated circuits by providing a membrane test head positioned underneath the IC package, wherein the membrane test head is coupled to an external tester. After the leads are electrically separated from each other and from the leadframe, the leads are aligned to the membrane test head and an inflatable bladder, which is positioned underneath the membrane test head, is inflated to couple the membrane test head to the leads. In this manner, one or more integrated circuits can be tested while still attached to the leadframe.

9 Claims, 2 Drawing Sheets

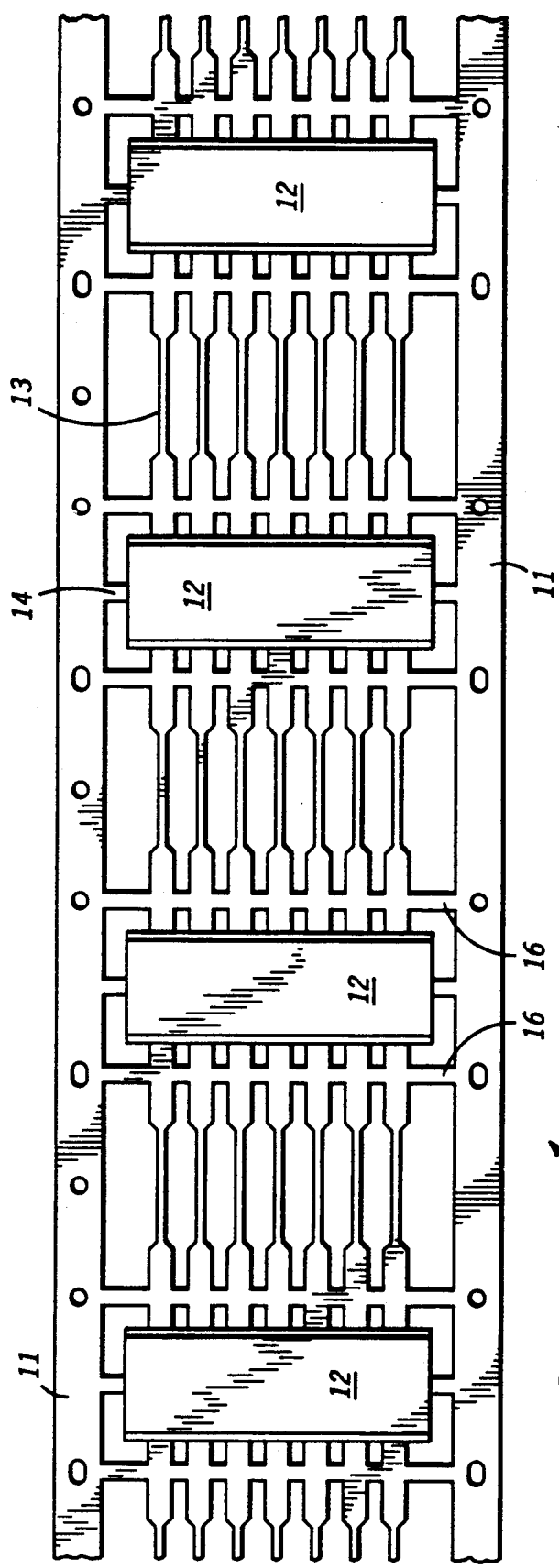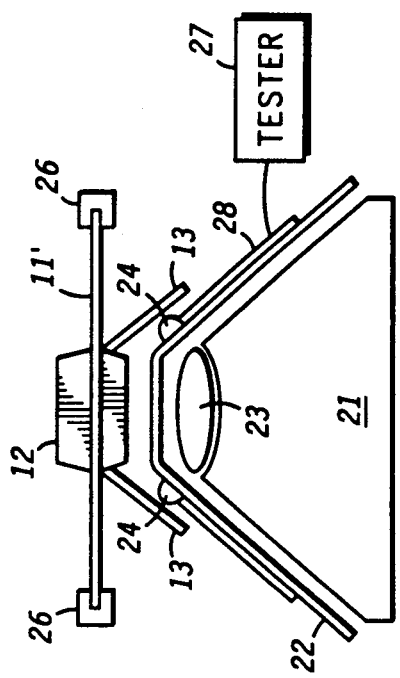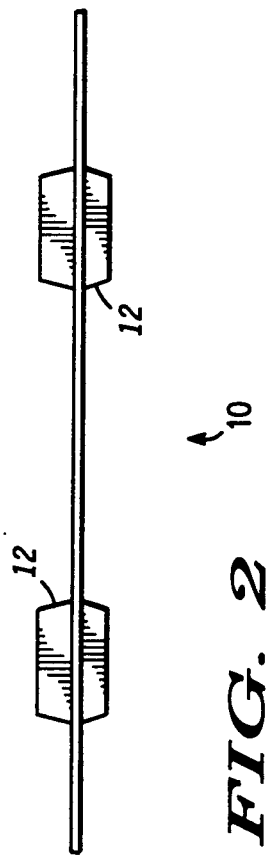

MEANS AND METHOD FOR TESTING INTEGRATED CIRCUITS ATTACHED TO A LEADFRAME

BACKGROUND OF THE INVENTION

The present invention relates, in general, to methods of testing integrated circuits, and more particularly, to a method of testing integrated circuits which are attached to a leadframe.

To ensure functionality, integrated circuits (ICs) must be tested several times before they are shipped to a customer. Although most processes involved in manufacturing integrated circuits are batch processes in which many circuits are processed at a single time, testing has usually called for individual handling of the circuits. Integrated circuits are usually encapsulated on leadframes which comprise a plurality of circuits, but it has been necessary to separate the circuits from the leadframe to test them. Once the circuits are removed from the leadframe, they are particularly fragile, and leads which extend from the package are easily bent or torn. Stringent requirements for lead and package quality placed on manufacturers make it important to handle the packaged integrated circuits as little as possible once they are removed from the leadframe. These requirements are not congruent with the manufacturer's need to handle and test each of the integrated circuit packages individually.

IC packages are usually attached to a leadframe by the leads themselves and by tie-bars which couple package to the leadframe. The packages are trimmed from the leadframe in a trim and leadform tool which has several stages, each stage performing only part of the trim process. After the leads are trimmed so that they are mechanically separated from the leadframe and from each other, they are usually lead formed into a predetermined shape to meet a customer's specification. After the leadform is complete, the tie-bars are cut, separating the IC package from the leadframe completely. The trim and leadform operations are performed sequentially in the same tool so that damage to the leads and package resulting from handling is minimal.

At a stage in the trim/leadform process after the leads were electrically separated from the leadframe but before the packages were mechanically separated from the leadframe the ICs were electrically separate from each other so that testing could be done, yet it was impossible to make electrical contact to the package leads for testing. A major difficulty with testing devices which are still attached to a leadframe is making contact to a large number of half-formed pins or leads in the narrow confines of the trim and leadform tool. Conventional test head geometries cannot make contact in these conditions.

Although testing is designed to improve the reliability of integrated circuits, often it compromises the quality of packaged devices. Individual loading and unloading of integrated circuits into test fixtures often damaged leads which extend outside the integrated circuit package. This damage was usually not repairable and resulted in completely functional devices being rejected for physical quality problems. In addition to lead damage, package damage also occured. Also, handling of packaged integrated circuits increased the chances of damage to the circuits themselves by electrostatic discharge. Although testing is necessary to provide the desired reliability and functionality, the above mentioned quality limits have long been a costly problem for circuit manufacturers.

Accordingly, it is an object of the present invention to provide a means and method for testing integrated circuits which are attached to a leadframe.

It is another object of the present invention to provide a means and method for testing integrated circuits which reduces cycle time.

Another object of the present invention is to provide a means and method for testing integrated circuits which reduces testing cost.

A further object of the present invention is to provide a means and method for testing integrated circuits which eliminates individual handling of the integrated circuits.

Still another object of the present invention is to provide a method of testing integrated circuits which improves package quality.

SUMMARY OF THE INVENTION

These and other objects and advantages of the present invention are achieved by a method of testing integrated circuits after the leads have been trimmed and partially formed, but before the packages have been removed from the leadframe. One stage of a trim and form process is adapted to test the integrated circuits by providing a membrane test head positioned underneath the IC package, wherein the membrane test head is coupled to an external tester. After the leads are electrically separated from each other and from the leadframe, the leads are aligned to the membrane test head and an inflatable bladder which is positioned underneath the membrane test head, is inflated to couple the membrane test head to the leads. In this manner, one or more integrated circuits can be tested while still attached to the leadframe.

BRIEF DESCRIPTION OF DRAWINGS

FIG. 1 illustrates a plan view of a portion of a leadframe on which integrated circuits are packaged;

FIG. 2 illustrates a side view of the leadframe shown in FIG. 1;

FIG. 3 illustrates a cross section of a tester of the present invention; and

DETAILED DESCRIPTION OF DRAWINGS

Figure 4:
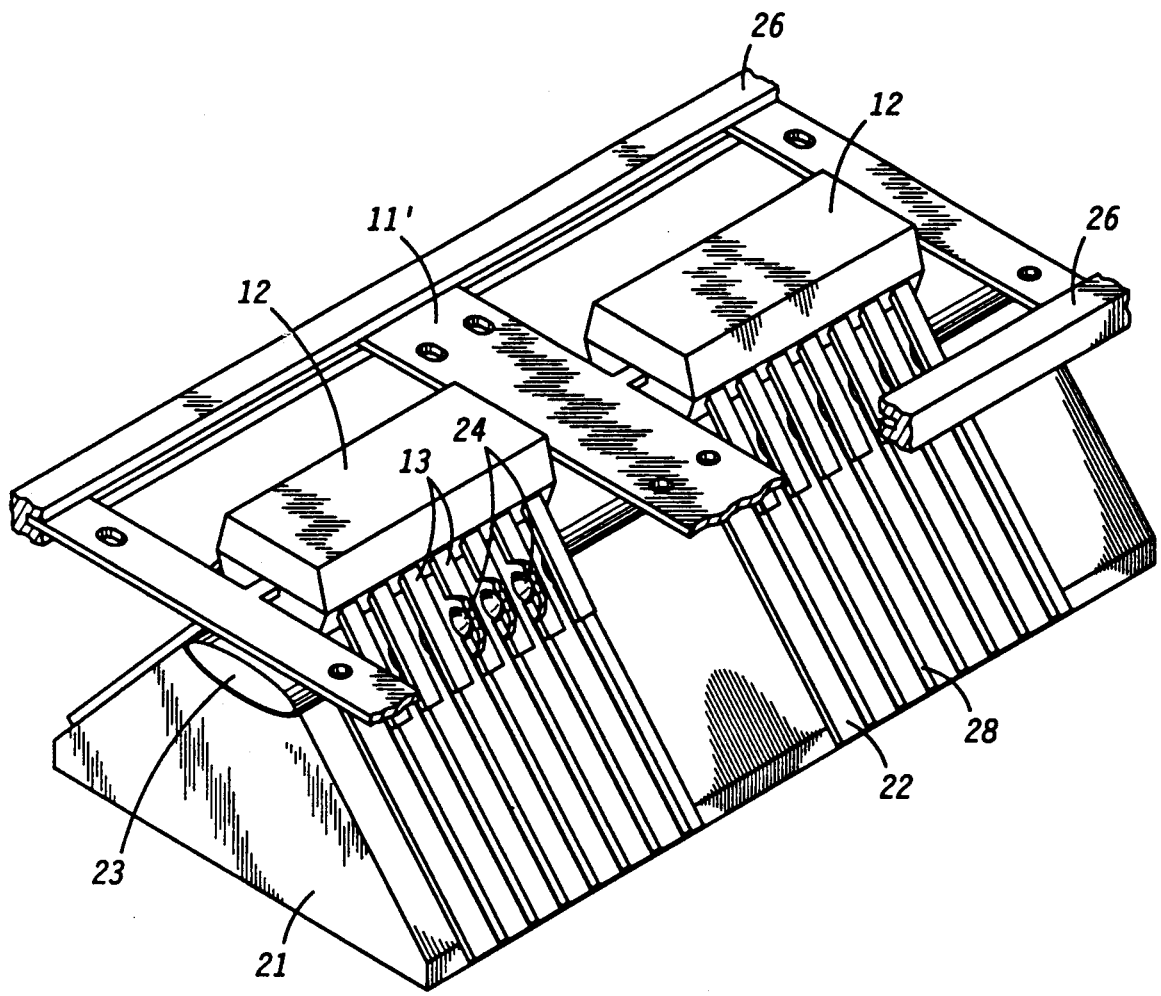
FIG. 4 illustrates a cut away perspective view of the apparatus shown in FIG. 3.

FIG. 1 shows a portion of a conventional leadframe used to package integrated circuits. Many packages 12 are formed on a leadframe, where each package 12 comprises an integrated circuit which is coupled to leads 13. FIG. 1 illustrates a leadframe after package 12 has been formed, encapsulating the integrated circuit chip. Package 12 provides mechanical support for leads 13 so they cannot be bent or deformed. Before encapsulation, however, tie-bar 16 must provide this mechanical support. Also, tie-bars 14 hold packages 12 to leadframe 11. Packages 12 may be oriented in a variety of ways on leadframe 11, for instance all packages 12 may be rotated 90° from the orientation shown in FIG. 1. Also, packages 12 may be interleaved to provide a tighter packing density. As will be seen, the testing method of the present invention can be modified to accommodate such variations.

FIG. 2 illustrates a side view of the leadframe shown in FIG. 1. As can be seen, packages 12 extend above and below leadframe 11 and leads 13, tie-bars 14 and 16, and side rails 11 all lie in the same plane. Spacing and orientation between packages 12 is fixed by the geometry of the leadframe.

In the past, the next step in processing of the leadframe shown in FIGS. 1 and 2 was to trim and leadform leads 13. This process was usually done in at least three stages. First, leads 13 were trimmed so that they were mechanically separate from each other and from leadframe 11. Next, leads 13 were leadformed into a predetermined shape which was specified by a customer. Lastly, tie-bars 14 were trimmed to separate packages 12 from leadframe 11. Conventionally, singulated packages 12 would then be transferred to a separate tester to evaluate functionality of the chip inside package 12.

FIG. 3 illustrates a cross-sectional view of a tester of the present invention. For ease of description, package 12 is shown with a different orientation with respect to leadframe 11' than shown in FIG. 1. The prime designation has been added in FIG. 3 to note this difference. Testing is performed in series with the trim and form process described hereinbefore. Testing is performed after mechanical separation of leads 13 yet before the leadform process is complete. Backing bar 21 provides a mechanical support for the rest of the test apparatus, and can be of any shape and material which adapts easily to the trim and leadform tool. A recess is formed in the top of backing bar 21 to hold inflatable bladder 23. Inflatable bladder 23 is a balloon-like bladder which can be inflated with gas or liquid. Membrane 22 is stretched over backing bar 21 and bladder 23. For ease of description, membrane 22 is shown separate from backing bar 21 and bladder 23, but it should be understood that in practice it is preferable that they rest against each other. Membrane 22 comprises a flexible printed circuit board such as UPILEX®, which is a registered trademark of UBE Industries, Ltd.

Membrane 22, probe bumps 24, and conductors 28 comprise what will be referred to as a membrane test head or a membrane probe. Probe bumps 24 and conductors 28 are formed using conventional printed circuit board techniques on a top surface of membrane 22. Alternatively, conductors 28 may be formed on a bottom surface while probe bumps 24 are on the top surface. In this case, conductors 28 must be coupled to probe bumps 24 by vias formed in membrane 22. Probe bumps 24 are sized so that they can couple to leads 13 as will be described in greater detail hereinafter. Conductive lines 28 couple probe bumps 24 to an edge of membrane 22. Tester 27 is coupled to conductive lines 28 at the edge of membrane 22 as it is conventionally done between testers and printed circuit boards. One probe bump 24/conductive line 28 pair is supplied for each lead 13 of package 12 to be tested.

Since conductors 28 and probe bumps 24 are formed with conventional printed circuit board techniques, it should be apparent that the membrane test head has a great deal of layout flexibility. The membrane test head can be adapted to various device types and leadframe orientations by simply changing the layout of probe bumps 24 and conductors 28 on the surface of membrane 22. It is desirable to form conductive lines 28 so that they are microstrip transmission lines to improve the quality of signals transmitted from the tester to the integrated circuit.

Package 12 is shown after leads 13 have been mechanically separated from each other and leadframe 11'. Leads 13 have been spanked down at an angle which is a first step in the leadform process. Before the leadform process is completed, leads 13 are aligned to probe bumps 24 as shown. Tie-bars 14 (see FIG.1) still couple package 12 to leadframe 11'. Supports 26 have a track which holds leadframe 11' in place during the trim, test, and leadform processes and allow the leadform to be indexed from one stage to the next. Because the location of package 12 is fixed with respect to leadframe 11', as are the locations of leads 13, alignment is easily accomplished when leadframe 11' is indexed into position over the membrane test head.

Once leads 13 are aligned to probe bumps 24, bladder 23 is inflated which in turn presses probe bumps 24 against leads 13. In this manner, contact is made between leads 13 and the tester. Power, ground, and test signals can be applied to leads 13 to evaluate the functionality of the integrated circuit inside package 12. Usually, leadframe 11' and tie bars 14 are coupled to the substrate of the integrated circuit inside package 12, therefore it may be necessary to provide a power or ground connection to leadframe 11' during testing. It should be noted also that several packages 12 be tested simultaneously in this manner by making bladder 23 into a long cigar-shaped bladder, and extending membrane 22 having a plurality of probe bumps 24, as shown in FIG. 4, along the length of bladder 23. When this is done, a plurality of integrated circuits can be tested simultaneously, greatly improving test cycle time.

After the circuit inside package 12 has been tested, it is desirable to record the pass/fail information for each package 12 in order to separate good from bad devices once the packages are singulated. Once testing is complete, bladder 23 is deflated to decouple probe bumps 24 from leads 13. Leadframe 11' is indexed to a portion of the trim and leadform tool which completes the leadforming. Once this is complete, tie-bars 14, shown in FIG. 1, are trimmed thus singulating packages 12 Now, circuits which have passed the test are separated from those which have failed the test using the recorded pass/fail information.

By now, it should be appreciated that a method of testing integrated circuits is provided which greatly improves the cycle time of the test operation by allowing parallel testing, and by testing in line with a trim and leadform process. Also, the testing method provided greatly reduces package defects and leadform damage during testing as the packages are firmly held in the leadframe during testing, and the leadform is completed after testing.

I claim:

1. A method of testing a plurality of integrated circuits which are enclosed in packages, wherein the packages are attached to a leadframe and a number of leads which are coupled to each of the integrated circuits extend from each package, the method comprising the steps of: separating the leads from each other and from the leadframe; coupling a tester to the leads; testing the integrated circuits; and separating the packages from the leadframe after testing.

2. The method of claim 1 further comprising the step of bending the leads away from the package after the step of separating the leads from each other and the leadframe; and moving test contacts to the leads in order to perform the coupling.

3. The method of claim 2 further comprising the step of bending the leads into a predefined shape after testing the integrated circuits and before separating the packages from the leadframe.

4. A test fixture for testing a plurality of packaged integrated circuits which are attached to a leadframe, wherein each of the integrated circuits has a plurality of leads which are isolated from the leadframe, the test fixture comprising:

a membrane test head having a plurality of contacts thereon positioned underneath the plurality of leads;

a tester coupled to the test head;

a drive means for moving the test head towards and away from the plurality of leads, wherein the membrane test head couples to a plurality of packaged ICs at one time.

5. The test fixture of claim 4 wherein the plurality of ICs are tested in parallel.

6. The test fixture of claim 4 wherein the ICs are tested serially by multiplexing the tester to each IC of the plurality of ICs.

7. A method for leadforming and testing a plurality of integrated circuits in individual packages, wherein the packages are attached to a leadframe by tie bars and a number of leads which are coupled to the integrated circuits, the method comprising: cutting the leads and the bars to electrically separate the number of leads from each other and from the leadframe; bending the leads so that a portion of each of the leads extends below the package; contacting the leads with a membrane test head located below the packages, the membrane test head having a number of probe bumps which are coupled to an external tester and which are aligned to the number of leads of the plurality of integrated circuits; an innflatable bladder located below the membrane test head; bending the leads to complete a leadform; and cutting the tie bars to separate the package from the leadframe.

8. The method of claim 7 further comprising providing a number of microstrip transmission lines formed on the membrane test head, wherein each microstrip transmission line is coupled to a probe bump and to the tester.

9. The method of claim 7 further comprising filling the inflatable bladder with gas to move the membrane test head so that the probe bumps couple to the leads.

* * * * *